(12) United States Patent
Cadien et al.

(10) Patent No.: US 12,302,605 B2
(45) Date of Patent: May 13, 2025

(54) HAFNIUM NITRIDE ADHESION LAYER

(71) Applicant: ZINITE CORPORATION, Edmonton (CA)

(72) Inventors: Kenneth C. Cadien, Edmonton (CA); Michael Clark, Edmonton (CA); Katherine Cook, Edmonton (CA); Korel Dawkins, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 0 days.

(21) Appl. No.: 18/637,959

(22) Filed: Apr. 17, 2024

(65) Prior Publication Data

US 2024/0355895 A1    Oct. 24, 2024

Related U.S. Application Data

(60) Provisional application No. 63/460,090, filed on Apr. 18, 2023.

(51) Int. Cl.
*H01L 21/28* (2025.01)
*H10D 30/01* (2025.01)
*H10D 30/67* (2025.01)

(52) U.S. Cl.
CPC ..... *H10D 30/673* (2025.01); *H01L 21/28194* (2013.01); *H10D 30/031* (2025.01); *H10D 30/6713* (2025.01); *H10D 30/6729* (2025.01)

(58) Field of Classification Search
CPC ......... H01L 29/42384; H01L 21/28194; H01L 29/41733; H01L 29/66742; H01L 29/78618
See application file for complete search history.

(56) References Cited

U.S. PATENT DOCUMENTS

| 2004/0198069 | A1 | 10/2004 | Metzner et al. |
| 2005/0271813 | A1 | 12/2005 | Kher et al. |
| 2007/0161180 | A1* | 7/2007 | Erben ............. C23C 16/34 438/243 |
| 2007/0166913 | A1* | 7/2007 | Won ............. H01L 28/60 257/E29.345 |
| 2012/0235118 | A1 | 9/2012 | Avouris et al. |

(Continued)

FOREIGN PATENT DOCUMENTS

| CN | 103346089 | * 10/2013 |
| CN | 107170828 | *  9/2017 |

(Continued)

OTHER PUBLICATIONS

Zeng, Sheng, et al. "TiO2-HfN Radial Nano-Heterojunction: A Hot Carrier Photoanode for Sunlight-Driven Water-Splitting." Catalysts 11.11 (2021): 1374.

*Primary Examiner* — Mohammad M Choudhry
(74) *Attorney, Agent, or Firm* — Perry + Currier Inc.

(57) ABSTRACT

A novel adhesion layer of hafnium nitride useful in the fabrication of semiconductor devices is disclosed. In particular, semiconductor devices such as, for example, thin film transistors which include one or more elements formed of metals with high electron concentrations, such as molybdenum, tungsten, nickel, ruthenium, cobalt and alloys thereof, can employ the present invention to better adhere the metal elements to the dielectric material on which the semiconductor devices are formed and the adhesion layer can also serve as a diffusion barrier.

10 Claims, 2 Drawing Sheets

(56) References Cited

U.S. PATENT DOCUMENTS

2014/0024207 A1   1/2014  Chan et al.
2018/0219089 A1*  8/2018  Nakayama .......... H01L 29/7787
2021/0193838 A1   6/2021  Ko

FOREIGN PATENT DOCUMENTS

JP     WO 2022190817   *  9/2022
WO   WO-2023285936 A1    1/2023

* cited by examiner

HAFNIUM NITRIDE ADHESION LAYER

FIELD OF THE INVENTION

The present invention relates to the manufacture of semiconductors. More specifically, the present invention relates to an adhesion layer, and the method of making such an adhesion layer, suitable for better affixing semiconductor elements made of metals with high electron concentrations within semiconductor devices.

BACKGROUND OF THE INVENTION

Known semiconductor device fabrication practices employ a variety of different materials to form the features of transistors and other semiconductor devices on substrates such as silicon. Depending on the semiconductor device to be manufactured, and in some cases the fabrication technology, the materials employed are selected for their atomic structures, electrical characteristics, physical chemistry, etc.

Most commonly, semiconductor devices are formed on substrates of silicon, on a dielectric layer of silicon dioxide first formed on the silicon substrate. The elements of the semiconductor devices, and the metal interconnects between devices, etc., are then formed in layers on the dielectric and on each other as necessary.

It is known that some materials which can be desired to be used to form elements of semiconductor devices do not adhere well to other materials used, such as silicon dioxide or other dielectric materials. Difficulties with adhesion can be particularly problematic when thin film transistors are being manufactured as factors such as residual film stress, morphology, density and mechanical properties of the film, etc. can result in the separation of the fabricated elements from the dielectric layer or from each other.

To address these issues, it is known to employ a suitable adhesion material as a layer between the silicon dioxide (or other dielectric material) and the material from which the particular semiconductor element is to be formed. Generally, an adhesion material must be carefully selected to be compatible with other materials employed in the semiconductor fabrication process and to survive, with no negative impact, the subsequent manufacturing processes which can include depositions, annealings, etc.

While a variety of adhesion materials are known, not all materials work with, or are suitable for, the variety of materials selected to form different semiconductor elements.

It is desired to have a novel adhesion material suitable for use, in particular for the fabrication of thin film transistors, in manufacturing semiconductor devices.

SUMMARY OF THE INVENTION

It is an object of the present invention to provide a novel adhesion layer and material, and method of manufacturing such, which obviates or mitigates at least one disadvantage of the prior art.

According to a first aspect of the present invention, there is provided a novel thin film transistor having a source, a drain, a metal oxide semiconductor extending there between, a gate dielectric over the metal oxide semiconductor and a gate over the gate dielectric, and including: a layer of dielectric material; a layer of hafnium nitride formed on at least a first region of the layer of dielectric material; the source being a metal with high electron concentration and formed on the at least first region of the hafnium nitride, the hafnium nitride acting as an adhesion layer between the source metal and the dielectric layer.

Preferably, the dielectric layer is $SiO_2$, Si, $Si_3N_4$, etc. Also preferably, the metal is selected from the group comprising molybdenum, tungsten, nickel, ruthenium, cobalt and/or alloys thereof.

According to another aspect of the present invention, there is provided a novel semiconductor device formed on a dielectric, the device including at least one element formed from a metal with a high electron concentration, the device including an adhesion layer of hafnium nitride formed on the dielectric and the at least one element formed of metal being formed on the adhesion layer of hafnium nitride.

According to yet another aspect of the present invention, there is provided a novel method of manufacturing a thin film transistor on a dielectric, comprising the steps of: i) forming a hafnium nitride adhesion layer over at least a first region of the dielectric, the adhesion layer being formed via atomic layer deposition; ii) forming at least one of a source element and a drain element over the adhesion layer in the at least first region, the at least one of a source element and a drain element being formed of a metal with a high electron concentration; iii) forming a metal oxide semiconductor layer between the source element and the drain element; iv) forming a gate dielectric over the semiconductor layer; and v) forming a gate over the gate dielectric.

The present invention provides a novel adhesion layer and material useful in the fabrication of semiconductor devices. In particular, semiconductor devices such as, for example, thin film transistors, which include one or more elements formed of a metal with a high electron concentration can employ the present invention to better adhere the metal elements to the dielectric material on which the transistor is formed.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
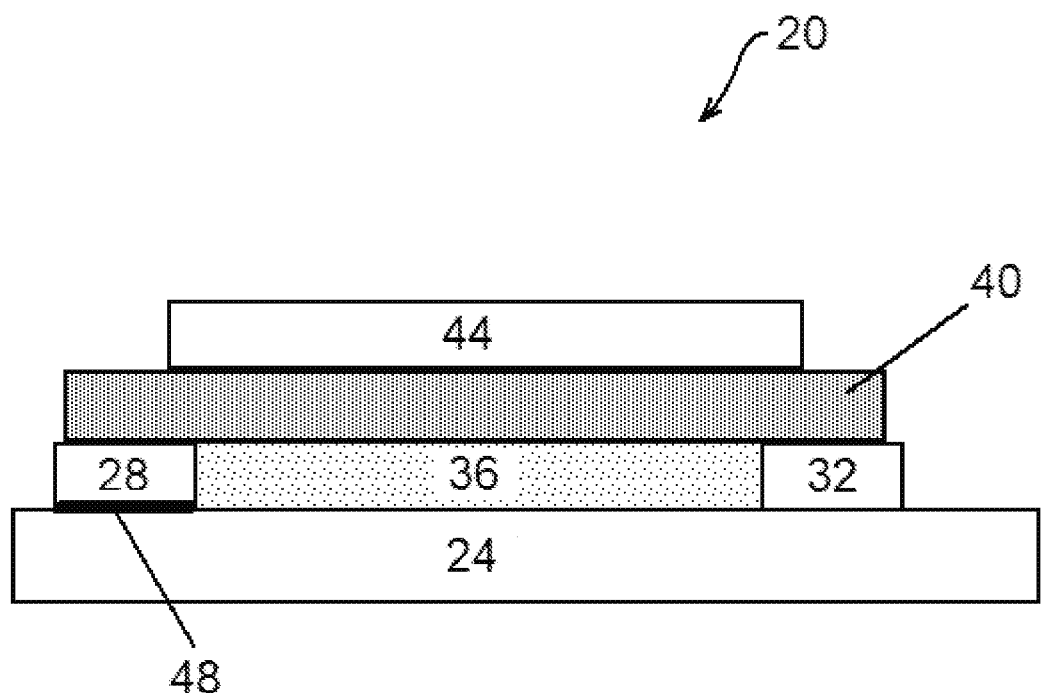
FIG. 1 shows a schematic representation of a transistor constructed with an adhesion layer in accordance with an aspect of the present invention.

It has been determined that for some semiconductor devices such as, for example, the Thin Film Transistors disclosed in published PCT patent application WO 2023/285936 (Barlage et al., the contents of which are incorporated herein by reference), metals with high electron concentrations (hereinafter referred to as "MHECs"), such as ruthenium, molybdenum, tungsten, nickel, cobalt and/or alloys of these MHECs, can be advantageously employed as the source and/or drain elements for the transistors.

However, it has been determined that MHECs do not adhere well to the common underlying dielectric materials (Thermal $SiO_2$, Si, $Si_3N_4$, PEALD $SiO_2$, WTO $SiO_2$, etc.) that such transistors can be formed on. Accordingly, the present inventors have determined that hafnium nitride (HfN) can be successfully employed as an adhesion layer to more effectively adhere MHEC features to a dielectric layer, such as silicon dioxide. Specifically, it has been determined that hafnium nitride acts to adhere MHECs to dielectric materials such as silicon dioxide and inhibits delamination and/or buckling of MHEC formed elements of semiconductor devices.

Advantageously, while hafnium nitride provides the desired adhesion properties for MHECs, it also serves as a diffusion barrier to prevent MHECs from otherwise undesirably interacting with the dielectric material, such as silicon dioxide or other dielectrics. In particular, the hafnium nitride layer inhibits the migration of oxygen from the dielectric layer to the MHEC element.

Yet another advantage of the present invention is that it can simplify the fabrication process for the above-mentioned Barlage et al Thin Film Transistors. In a preferred embodiment, at least some features of the Barlage et al Thin Film Transistors are fabricated using Atomic Layer Deposition (ALD) and, in a preferred aspect, their gate dielectric is hafnium dioxide ($HfO_2$) formed from a hafnium ALD precursor. This same precursor, when combined with nitrogen as the reactant gas, can also be employed to form the desired hafnium nitride adhesion layer.

By employing the same ALD precursor to form the desired adhesion layer and the gate dielectric for the Thin Film Transistors, the overall manufacturing process can thereby be simplified.

As a non-limiting example, adhesion films of hafnium nitride (HfN) were grown using a plasma-enhanced atomic layer deposition (PEALD) continuous flow ALD system, in this example an ALD150-LX, manufactured by Kurt J. Lesker. The film was grown at 1.01 Torr reactor pressure, using remote inductively coupled plasma (13.56 MHz ICP, 0.6 KW, 60 sccm FG with 100 sccm Ar carrier).

Tetrakis(dimethylamino) Hafnium (TDMAHf) and forming gas (FG: 5% $H_2$+95% $N_2$) were the Hf-precursor and the reactant plasma source, respectively. Process conditions for self-limiting HfN PEALD were characterized using in situ spectroscopic ellipsometry (M2000DI, J. A. Woollam). Growth-per-cycle (GPC) determined on a planar Si substrate for the PEALD cycle: 0.1 s TDMAHf pulse, 12 s post-precursor purge, 9 s FG plasma exposure, and 5 s post-plasma purge. HfN grown with this process, and with an ampoule temperature of 78° C. and substrate temperature of 200° C., yielded a GPC of approximately 1.08 Å/cycle.

FIG. 1 shows a thin film transistor 20, which is formed on a dielectric layer 24, and which comprises a source 28, a drain 32, a semiconductor layer 36 formed between source 28 and drain 32, a gate dielectric 40 formed over semiconductor layer 36 and a gate 44 formed over gate dielectric 40. As can be seen, a hafnium adhesion layer 48 was formed on dielectric layer 24 before source 28 was formed thereon and adhesion layer 48 operates to enhance the adhesion of source 28 on dielectric layer 24.

Figure 2:
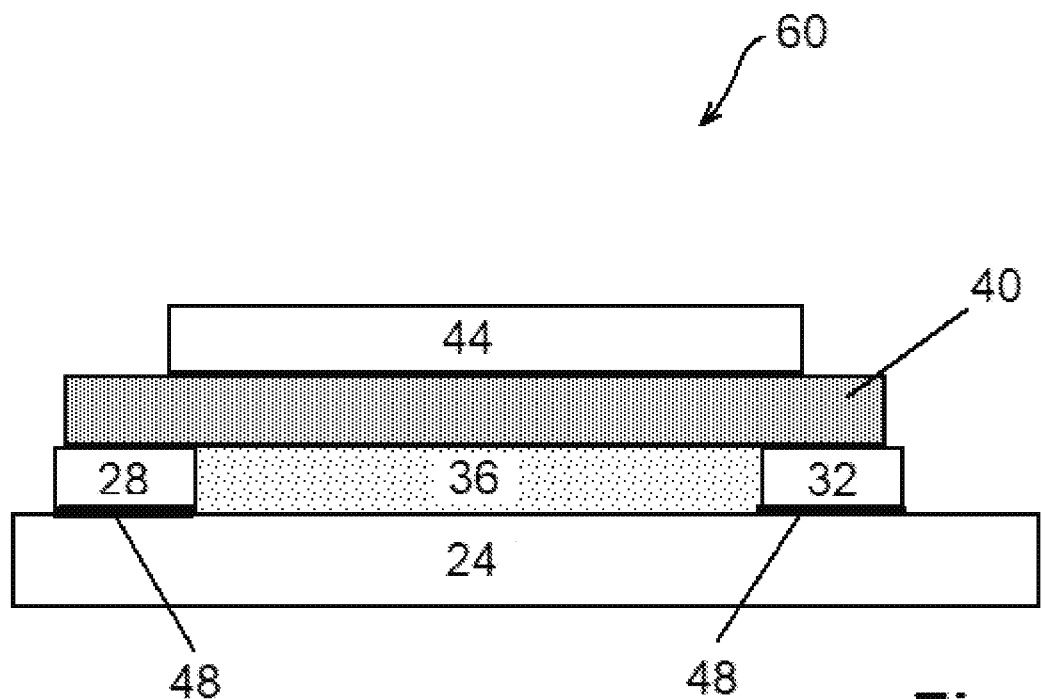
FIG. 2 shows a schematic representation of another transistor constructed with an adhesion layer in accordance with an aspect of the present invention.

FIG. 2 shows another thin film transistor 60 wherein like components to those shown in FIG. 1 are indicated with like reference numbers. In transistor 60, an adhesion layer 48 was formed on dielectric layer 24 to enhance the adhesion of both source 28 and drain 32 to dielectric layer 24.

Figure 3:
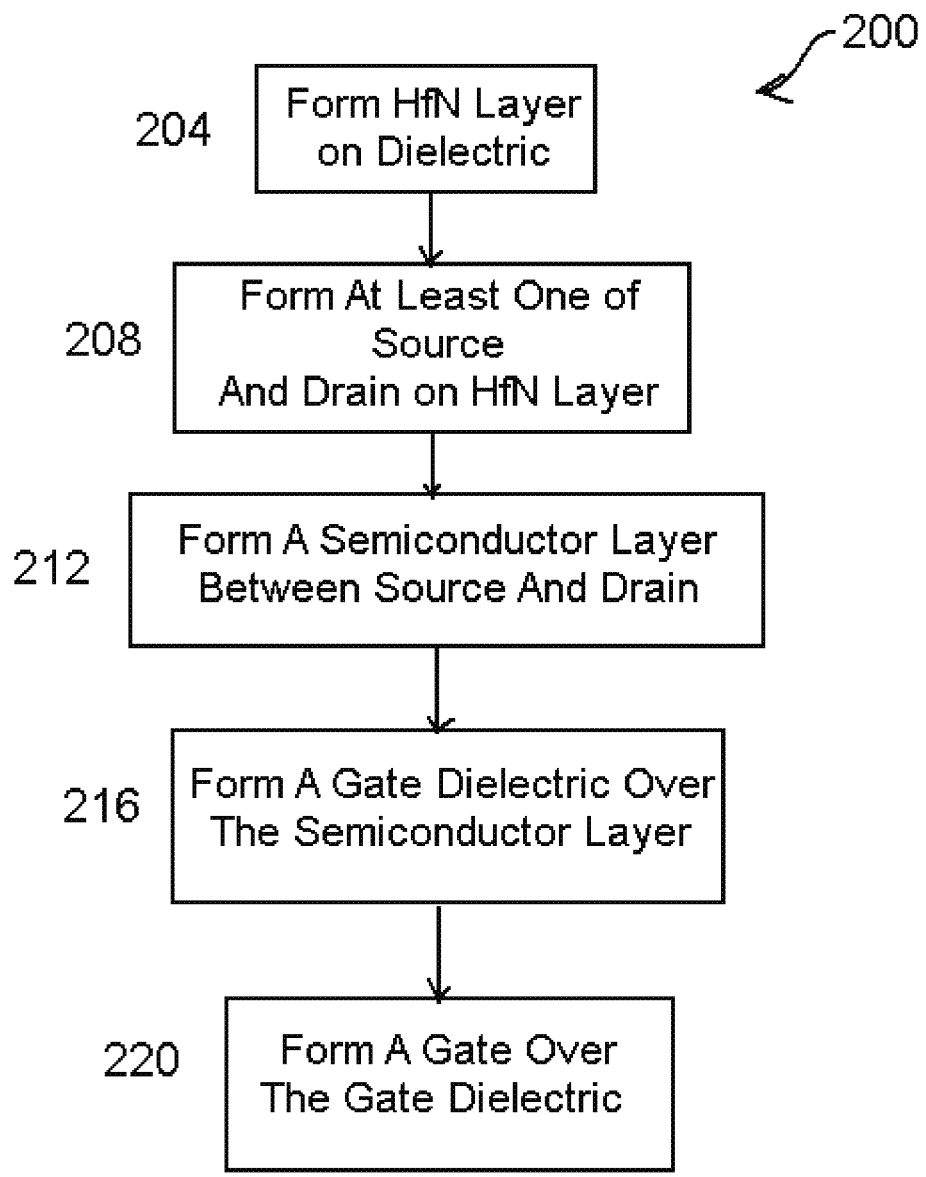
FIG. 3 shows a flowchart of a method of constructing a transistor with an adhesion layer in accordance with an aspect of the present invention.

FIG. 3 shows a flowchart 200 of a method of fabricating a thin film transistor in accordance with an aspect of the present invention. The method starts at step 204 wherein a forming a hafnium nitride adhesion layer is formed over at least the region of a dielectric where an MHEC element (the source, drain or both) is to be formed, the adhesion layer being formed via atomic layer deposition with a suitable hafnium precursor gas. Next, the method proceeds at step 208 wherein the source and/or drain element is formed atop the hafnium nitride layer. Next, at step 212, a metal oxide semiconductor layer between the source and the drain. Next, at step 216 a gate dielectric is formed over the metal oxide semiconductor. The method completes at step 220 where a gate is formed over the gate dielectric.

Preferably, the gate dielectric is hafnium dioxide and is formed with the same hafnium precursor used to form the adhesion layer in a plasma enhanced atomic layer deposition process with a forming gas including nitrogen, such as a 5% H and 95% N mixture.

One of the unique aspects of the Barlage et al Thin Film Transistors is that they can be built on top of conventional CMOS circuitry or atop other layers of Barlage et al transistors to create stacked (3D) semiconductor devices. In such cases, the Barlage et al transistors merely require that a layer of dielectric material be formed over the underlying circuitry (CMOS, Barlage et al, etc.) and then the present invention can be employed to provide an adhesion layer atop that dielectric layer for the subsequent forming of the Barlage et al transistors.

The above-described embodiments of the invention are intended to be examples of the present invention and alterations and modifications may be effected thereto, by those of skill in the art, without departing from the scope of the invention which is defined solely by the claims appended hereto.

We claim:

1. A method of manufacturing a thin film transistor, the method comprising:
   forming a hafnium nitride adhesion layer on at least a first region of a substrate, the hafnium nitride adhesion layer being formed via atomic layer deposition;
   forming at least one of a source element and a drain element on the hafnium nitride adhesion layer in the at least first region of the substrate, the at least one of the source element and the drain element being formed of a metal with high electron concentration;
   forming a metal oxide semiconductor layer on the substrate between the source element and the drain element;
   forming a gate dielectric over the metal oxide semiconductor layer; and
   forming a gate over the gate dielectric;
   wherein the hafnium nitride adhesion layer adheres the at least one of the source element and the drain element of the metal with high electron concentration to the substrate, and wherein the hafnium nitride adhesion layer inhibits migration of oxygen from the substrate to the at least one of the source element and the drain element of the metal with high electron concentration.

2. The method of claim 1 wherein the hafnium nitride adhesion layer is formed by plasma enhanced atomic layer deposition.

3. The method of claim 1 wherein the gate dielectric is hafnium dioxide and is formed by atomic layer deposition.

4. The method of claim 3 wherein the hafnium nitride adhesion layer and the gate dielectric are formed from the same hafnium precursor.

5. The method of claim 3 wherein the gate dielectric is formed by plasma enhanced atomic layer deposition.

6. The method of claim 1 wherein the metal with high electron concentration is selected from the group comprising molybdenum, tungsten, nickel, ruthenium, cobalt and alloys thereof.

7. A method of manufacturing a thin film transistor on a dielectric, comprising:
- forming a hafnium nitride adhesion layer over at least a first region of the dielectric, the hafnium nitride adhesion layer being formed via atomic layer deposition;
- forming at least one of a source element and a drain element over the hafnium nitride adhesion layer in the at least first region, the at least one of the source element and the drain element being formed of a metal with high electron concentration;
- forming a metal oxide semiconductor layer between the source element and the drain element;
- forming a gate dielectric over the metal oxide semiconductor layer; and
- forming a gate over the gate dielectric;
- wherein the hafnium nitride adhesion layer adheres the metal with high electron concentration to the dielectric, and wherein the hafnium nitride adhesion layer inhibits migration of oxygen from the dielectric to the metal with high electron concentration;
- wherein the gate dielectric is hafnium dioxide and is formed by atomic layer deposition; and
- wherein the hafnium nitride adhesion layer and the gate dielectric are formed from the same hafnium precursor.

8. The method of claim 7 wherein the hafnium nitride adhesion layer is formed by plasma enhanced atomic layer deposition.

9. The method of claim 7 wherein the gate dielectric is formed by plasma enhanced atomic layer deposition.

10. The method of claim 7 wherein the metal with high electron concentration is selected from the group comprising molybdenum, tungsten, nickel, ruthenium, cobalt and alloys thereof.

* * * * *